US009447513B2

(12) United States Patent
Mardilovich et al.

(10) Patent No.: US 9,447,513 B2
(45) Date of Patent: Sep. 20, 2016

(54) NANO-SCALE STRUCTURES

(75) Inventors: Peter Mardilovich, Corvallis, OR (US); Qingqiao Wei, Corvallis, OR (US); Anthony M. Fuller, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 388 days.

(21) Appl. No.: 13/878,202

(22) PCT Filed: Oct. 13, 2011

(86) PCT No.: PCT/US2011/056067

§ 371 (c)(1), (2), (4) Date: Apr. 6, 2013

(87) PCT Pub. No.: WO2012/054286

PCT Pub. Date: Apr. 26, 2012

(65) Prior Publication Data

US 2013/0189497 A1 Jul. 25, 2013

Related U.S. Application Data

(63) Continuation-in-part of application No. PCT/US2010/053533, filed on Oct. 21, 2010.

(51) Int. Cl.

| | |
|---|---|
| ***B05D 5/00*** | (2006.01) |
| ***C25D 1/00*** | (2006.01) |
| ***C25D 1/10*** | (2006.01) |
| ***C25D 11/04*** | (2006.01) |
| ***C25D 11/26*** | (2006.01) |
| ***B81C 1/00*** | (2006.01) |

(52) U.S. Cl.

CPC ................ *C25D 1/006* (2013.01); *B05D 5/00* (2013.01); *B81C 1/00031* (2013.01); *C25D 1/10* (2013.01); *C25D 11/045* (2013.01); *C25D 11/26* (2013.01); *B81B 2203/0361* (2013.01); *B81B 2207/056* (2013.01); *Y10T 428/2462* (2015.01)

(58) Field of Classification Search

CPC ........................................................ B05D 5/00

See application file for complete search history.

(56) References Cited

U.S. PATENT DOCUMENTS

| | | | | |
|---|---|---|---|---|
| 6,987,071 | B1 | 1/2006 | Bollman et al. | |
| 7,691,201 | B2 | 4/2010 | Kamins et al. | |
| 2006/0231946 | A1* | 10/2006 | Pan | H01L 23/373 257/712 |
| 2006/0234505 | A1* | 10/2006 | Asano et al. | 438/688 |
| 2006/0255450 | A1* | 11/2006 | Pan | H01L 21/6835 257/712 |

(Continued)

FOREIGN PATENT DOCUMENTS

| | | |
|---|---|---|
| CN | 101275209 | 10/2008 |
| CN | 101393938 | 3/2009 |

(Continued)

OTHER PUBLICATIONS

Huang, Zhulin et a!. Improved SERS performance from Au nanopillar arrays by abridging the pillar tip spacing by Ag sputtering. Advanced Materials. Oct. 1, 2010, vol. 22, pp. 4136-4139.

(Continued)

*Primary Examiner* — Nathan Empie

(74) *Attorney, Agent, or Firm* — HP Inc. Patent Department

(57) ABSTRACT

Nano-scale structures are provided wherein nano-structures are formed on a substrate surface and a base material is applied between the nano-structures.

15 Claims, 4 Drawing Sheets

(56) References Cited

U.S. PATENT DOCUMENTS

| | | | | |
|---|---|---|---|---|
| 2007/0217072 | A1* | 9/2007 | Oikawa | 360/135 |
| 2008/0037173 | A1* | 2/2008 | Saito et al. | 360/135 |
| 2008/0093698 | A1 | 4/2008 | Tsakalakos et al. | |
| 2011/0245074 | A1* | 10/2011 | Smith | B01J 23/30<br>502/309 |

FOREIGN PATENT DOCUMENTS

| | | |
|---|---|---|
| CN | 101552322 | 10/2009 |
| WO | WO-2009106636 | 9/2009 |

OTHER PUBLICATIONS

Mozalev, A. et al. Nucleation and growth of the nanostructured anodic oxides on tantalum and niobium under the porous alumina film. Electrochimica Acta. 2003, vol. 48. pp. 3155-3170.

Nielsch, Kornelius et al. Uniform nickel deposition into ordered alumina por es by pulsed electrodeposition. Advanced Materials. 2000, vol. 12, No. 8, pp. 582-586.

Teh, L. K. et al. Electrodeposition of CdSe on nanopatterned pillar arrays f or photonic and photovoltaic applications. Thin Solid Films. 2007, vol. 515, pp. 5787-5781.

Wu, W. et al., Electrochemically Superfilling of N-type ZnO Nanorod Arrays with P-type CuSCN Semiconductor, (Research Paper), Electrochemistry Communications, Sep. 2009, pp. 1736-1739, vol. 11, No. 9.

Jingbiao Cui et al.; A Simple Two-step Electrodeposition of CU20ZnO Nanopillar Solar Cells; J. Phys. Chem. C., vol. 114, No. 14; Mar. 20, 2010, pp. 6408-6412.

Mozalev et al; Growth of Multioxide Planar Film With the Nanoscale Inner Structure via Anodizing ALTa Layers on Si; Electrochimica Acta 54; Jun. 13, 2008; pp. 935-945.

* cited by examiner

NANO-SCALE STRUCTURES

BACKGROUND

Nano-structures are suitable for use in a wide variety of applications, including applications for shock absorption, promoting adhesion, tuning surface wettability, and micro- or nano-fluidic filtration, among other applications. Nano-scale structures may be formed on a surface using a template formed on a surface, and then filling pores in the template with a select material. Once the pores are sufficiently filled, the template may be removed to expose nano-structures on and above the surface.

BRIEF DESCRIPTION OF THE DRAWINGS

Features and advantages of embodiments of the present disclosure will become apparent with reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
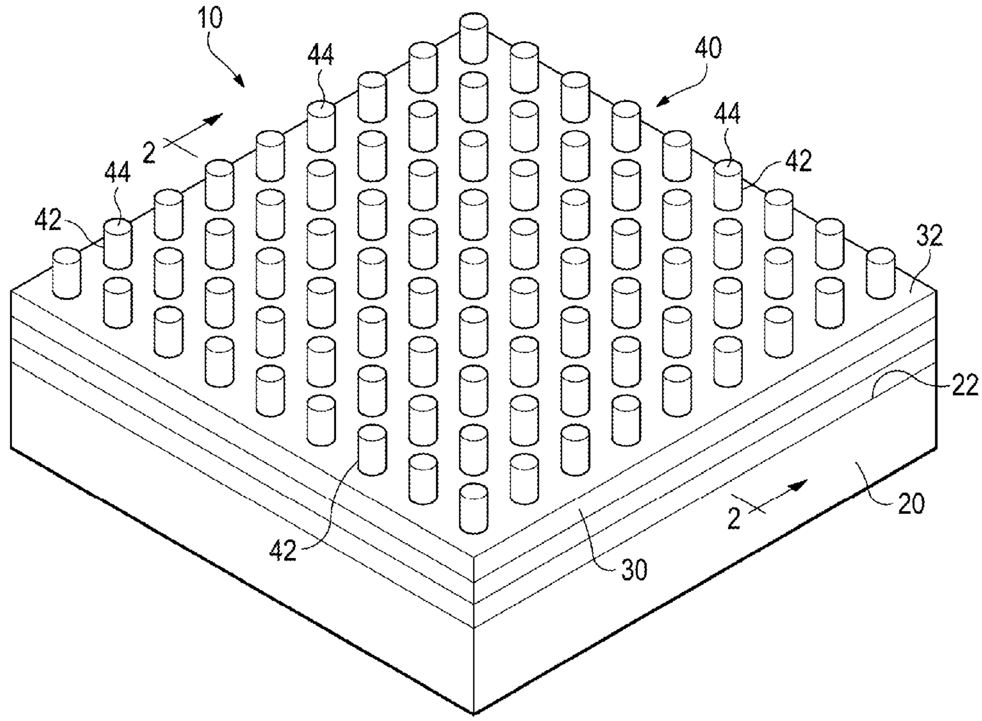
FIG. 1 is a simplified perspective view of an example article including nano-structures extending from a base layer formed in accordance with an embodiment of the present invention.

Referring initially to FIG. 1, an article 10 is shown, the depicted article including a substrate 20 having a base layer 30 and a nano-structure array 40 extending therefrom. As will be described further below, the nano-structure array may include nano-structures 42 formed on a substrate surface 22. The base layer, in turn, may be formed by applying a base material between the nano-structures. The base material may be virtually any material, but in the present examples, is selected from materials suitable for electrochemical deposition in order to achieve nano-scale structures, as described below Base layer 30 may define a substantially planar base surface 32, from which nano-structures 42 extend. Accordingly, where the nano-structures are of substantially uniform height, as in the present examples, the nano-structures will be seen to terminate in distal ends 44 that are substantially uniformly spaced from base surface 32. The nano-structures also may be of substantially uniformly size and shape, and may be substantially uniformly distributed across base layer 32.

The methods disclosed herein may be used to control various properties of the nano-structures. For example, placement of nano-structures in the nano-structure array may be selectively controlled. Similarly, the size of gap formed between adjacent nano-structures may be controlled, and the geometry and/or dimensions of the nano-structures (such as their height, diameter, shape, etc.) may be controlled.

Figure 2:
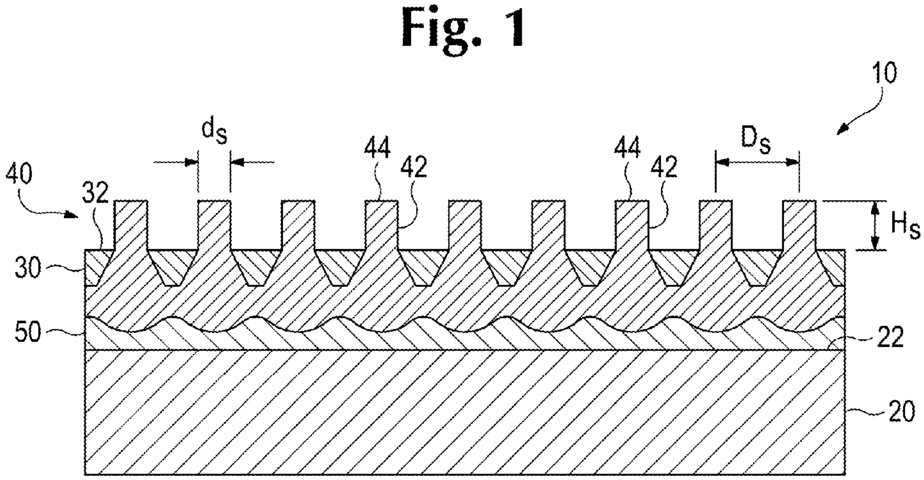
FIG. 2 is a somewhat schematic cross-sectional view of the example article shown in FIG. 1, taken generally along line 2-2 of FIG. 1.

In one example, nano-structures 42 are elongate structures that extend orthogonal to a plane defined by substrate surface 22. As shown in FIG. 2, nano-structures 42 are generally columnar, each characterized as having a diameter ($d_S$) (also referred to herein as thickness) and a height ($H_S$) above base layer 30. The geometry of the nano-structures may be controlled so that the nano-structures each have a substantially cylindrical shape. The nano-structures also may have substantially uniform height ($H_S$), and the substantially uniform pitch ($D_S$) (the center-to-center distance between nano-structures). Dimensions of nano-structures generally will vary by less than 10% to 20% (for nanometer scale dimensions), and in some examples, may vary by as little as 1% or 2%.

Although columnar nano-structures are shown for illustrative purposes, the nano-structures can have other geometries, which may be determined at least in part by parameters of the fabrication process described below. For example, height, diameter, shape, and spacing between nano-structures may be controlled. It thus will be appreciated that the fabrication process may be manipulated to tune nano-structure geometry and spacing to accommodate a variety of purposes.

FIGS. 3A-3E depict an article 10 throughout fabrication of a nano-structured substrate as described herein. As shown, a substrate 20 thus may be adapted, through the present method, to define an integral nano-structured surface 22. Although a particular nano-structure geometry is shown, it will be understood that the fabrication process parameters may be altered to achieve different geometries.

Figure 3A:
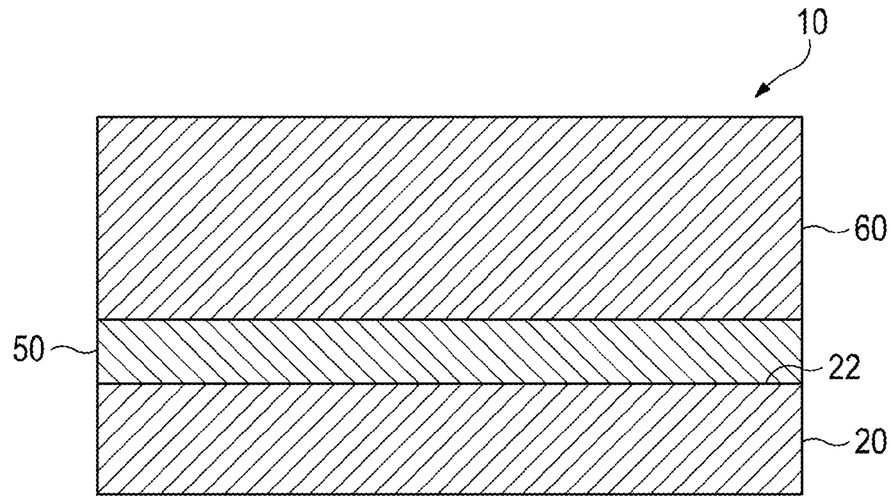
FIGS. 3A through 3E schematically depict a method of forming a nano-structure array and base layer in accordance with an embodiment of the present invention.

Referring initially to FIG. 3A, fabrication begins with a substrate 20. Substrate 20 may be selected based, at least in part, on the whether or not the material will provide a suitably planar surface 22 and/or based on the intended use of the article to be produced. In some examples, substrate 20 may be a substantially planar silicon wafer. Substrate 20, however, similarly may be formed from other materials, e.g., glass, quartz, alumina, stainless steel, plastic, and/or the like, and may take any of a variety of forms, including a multi-layer structure.

As shown, a first oxidizable material (also referred to as an oxidizable nano-structure material) is deposited on a surface 22 of substrate 20 to form a layer of first oxidizable material 50. The first oxidizable material layer 50 may be formed using any suitable deposition technique known in the art. Some non-limiting examples of suitable deposition techniques include physical vapor deposition (PVD) (such as sputtering, thermal evaporation and pulsed laser deposition), atomic layer deposition (ALD), or, in some instances, chemical vapor deposition (CVD).

In some examples, the first oxidizable material layer 50 may be formed of a metal or metal alloy that forms a dense metal oxide after electrochemical oxidation. Suitable oxidizable materials include oxidizable refractory metals such as tantalum (Ta), niobium (Nb), titanium (Ti), tungsten (W), or their alloys. Such oxidizable materials can be electrochemically and/or thermally oxidized, and have expansion coefficients (the ratio between thickness of the grown oxide and thickness of the consumed material) that are greater than 1.

In the present example, first oxidizable material layer 50 is formed of tantalum (Ta), which has been found suitable for use in the method described herein. The example first oxidizable material layer thus also may be referred to herein as the "Ta layer". The Ta layer may have any suitable thickness that will produce (during electrochemical oxidation) enough oxide to form the desired nano-structures (which will be described in further detail below). In some examples, the thickness of the Ta layer may be approximately 100 to 1000 nanometers.

Referring still to FIG. 3A, it will be noted that a second oxidizable material (also referred to as an oxidizable template material) is deposited on the Ta layer to form a layer of second oxidizable material 60. The second oxidizable material layer may be a material selected to produce a porous oxide (as described below), with pours that correspond to the nano-structures to be formed. The second oxidizable material may be aluminum (Al), or may be an aluminum alloy such as an alloy having aluminum as the main component. Second oxidizable material layer 60 also may be referred to herein as the "Al layer". The Al layer may have any suitable thickness that will produce (by electrochemical oxidation) enough oxide to form a template sufficient to define nano-structures, as will be described below. In some examples, the thickness of the Al layer may be approximately 100 to 1000 nanometers.

Deposition of the Al layer on the Ta layer may be accomplished using any suitable deposition technique known in the art. Some non-limiting examples of suitable deposition techniques include physical vapor deposition (PVD) (such as sputtering, thermal evaporation and pulsed laser deposition).

Figure 3B:
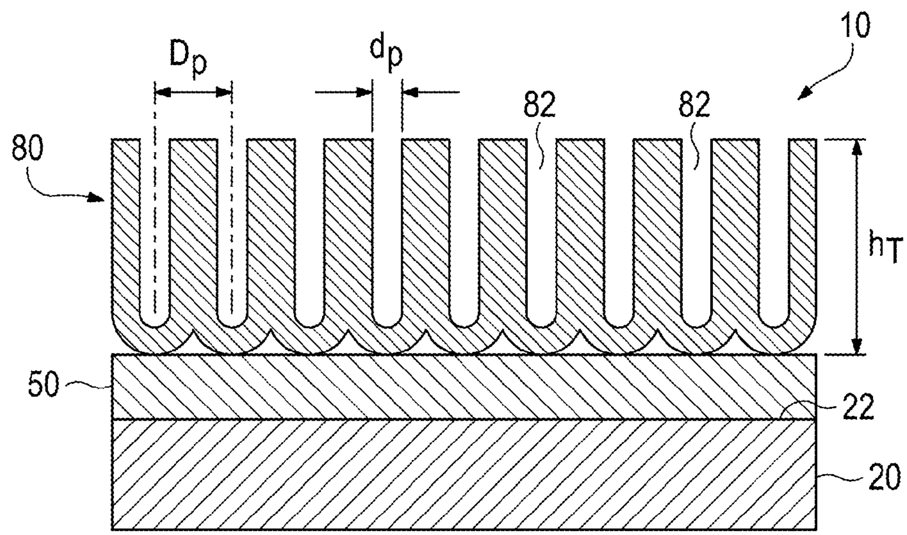

As shown generally in FIG. 3B, the multi-layer structure of FIG. 3A may be further processed to form a nano-structure template 80 on substrate 20. The nano-structure template defines a plurality of nano-pores 82, each having a first width (indicated as nano-pore diameter ($d_p$), in the present example). Such nano-pores are suitable for use in forming nano-structures 42 (FIG. 3C) on the substrate surface, as will be described further below.

In some examples, further processing includes a first anodization process whereby Al layer 60 (FIG. 3A) is anodized to define a plurality of substantially uniform, cylindrical nano-pores 82. Such nano-pores may be formed by completely anodizing the Al layer (as shown in FIG. 3B) so as to produce a nano-structure template 80 in the form of a layer of porous oxide (e.g., anodic porous alumina, $Al_2O_3$) with nano-pores 82. Complete anodization refers to the oxidation of substantially the entire Al layer so as to allow anodization of underlying first oxidizable material layer 50, as will be described below.

Anodization (i.e., electrochemical oxidation) is a process of forming an oxide layer on a material by making the material the anode in an electrolytic cell and passing an electric current through the cell. For anodization of aluminum, as in the present example, applied voltage may be kept constant at a voltage within a range of about 10 V to 200 V. In some examples, the first anodization process may occur at a voltage of about 30 V.

As indicated generally above, it is possible to adjust geometry by adjusting parameters of the fabrication process. For example, geometry of the nano-structure template 80 may be adjusted by varying one or more of anodization voltage, current density and electrolyte. Such adjustments to the first anodization process may alter nano-pore pitch ($D_p$) and/or nano-pore diameter ($d_p$), which characteristics are illustrated in FIG. 3B. For example, nano-pore pitch may be related to anodization voltage, where nano-pore pitch ($D_p$) is 2.8 nanometers per volt of anodization voltage. Nano-pore pitch ($D_p$) generally may be adjusted within a range of from about 30 nanometers to about 500 nanometers. Nano-pore diameter ($d_p$) generally may be adjusted within a range of from about 10 nanometers to about 350 nanometers.

Anodization can be performed at constant current (galvanostatic regime), at constant voltage (potentiostatic regime) or at some combination of these regimes. Nano-pore diameter ($d_p$) is proportional to anodization voltage. Accordingly, a potentiostatic regime may be employed to produce a porous substrate with nano-pores having substantially uniform nano-pore diameter ($d_p$). Substantially uniform nano-pores 82, in turn, will yield substantially uniform nano-pillars 40, as will be described below.

The first anodization process may be carried out by exposing Al layer 60 to an electrolytic bath containing an oxidizing acid such as sulfuric acid ($H_2SO_4$), phosphoric acid ($H_3PO_4$) oxalic acid ($C_2H_2O_4$) and/or chromic acid ($H_2CrO_4$). The electrolyte may be present, for example, in a water-based solution. The voltage applied during the first anodization process may be selected based on the electrolyte composition. For example, the voltage may range from 5-25V for an electrolyte based on sulfuric acid, 10-80V for an electrolyte based on oxalic acid, and 50-150V for an electrolyte based on phosphoric acid. The particular voltage used will depend on the desired pore diameter (and the suitability of such voltage for the electrolyte).

Nano-pore diameter ($d_p$) also is related to the nature of the electrolyte used. Accordingly, an electrolyte may be selected to achieve a particular desired nano-pore diameter ($d_p$). As non-limiting examples, nano-pores 82 of the following sizes may be obtained using the following electrolytes: nano-pore diameters ($d_p$) of about 20 nanometers may be obtained using $H_2SO_4$ (in a water-based solution) as the electrolyte; nano-pores diameters ($d_p$) of about 40 nanometers may be obtained using $C_2H_2O_4$ (in a water-based solution) as the electrolyte; and nano-pores diameters ($d_p$) of about 120 nanometers may be obtained using $H_3PO_4$ (in a water-based solution) as the electrolyte.

In one example, nano-structure template 80 is formed by anodization of the Al layer 60 in a 4% solution of oxalic acid ($C_2H_2O_4$), at a voltage of 30 Volts until substantially the entire Al layer is consumed. For a suitably thick Al layer, the resulting nano-structure template 80 will define nano-pores 82 that are approximately 30 nanometers wide, and that will allow oxidation of underlying first oxidizable material layer 50. The nano-structure template should have a template height ($h_T$) sufficient to allow complete growth of a nano-structures 42 (FIG. 3C) within the nano-pores.

After the first anodization process, the nano-pore diameter ($d_p$) may be further tuned to a target nano-pore diameter by anisotropic etching, or other suitable process (not shown). Anisotropic etching may be performed using diluted phosphoric acid (5 vol. %). The time for etching may vary, depending, at least in part, upon the desirable average diameter for the final pores. The temperature for etching may also depend upon the process, the etching rate, and the etchant used.

In some examples (not shown), prior to performing the first anodization process, the first oxidizable material layer may be patterned to precisely define locations of nano-pores 82 in the resulting nano-structure template 80. Patterning may be accomplished via any suitable technique. The patterned layer may then be anodized, for example, by employing the patterned layer as the anode of an electrolytic cell. A suitable amount of voltage and current is then applied to the electrolytic cell for an amount of time to completely anodize the patterned layer in accordance with the first anodization process described above. This can result in substantially uniformly spaced nano-structures where the variance in spacing between nano-structures differs by less than 1% (for nanometer scale dimensions).

Figure 3C:
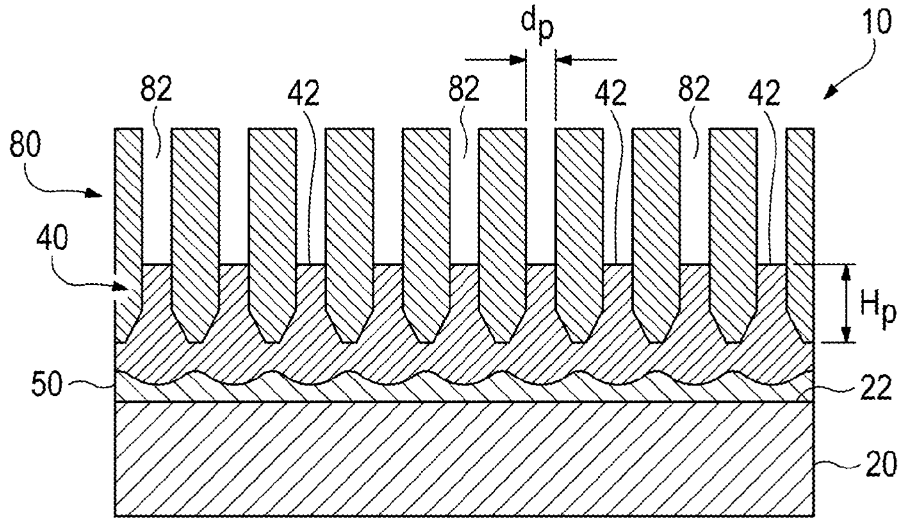

Referring now to FIG. 3C, nano-pores 82 may be at least partially filled to define nano-structures 42. Nano-structures 42 extend into the nano-pores to a height ($H_P$). As shown, height ($H_P$) may be substantially uniform across the substrate 20.

Nano-structures 42 may be formed via a second anodization process selected to anodize the underlying Ta layer 50. Such second anodization process will grow an oxide from the first oxidizable material (e.g., Ta), with oxide forming in the nano-pores 82 of the nano-structure template 80 from the bottom up. The resulting oxide may take the form of a dense oxide such as anodic tantalum pentoxide ($Ta_2O_5$).

The second anodization process may be accomplished, for example, using a process similar to the first anodization process described above. More specifically, the Ta layer 50 may be anodized by employing the Ta layer as the anode of an electrolytic cell to achieve a desired oxidation of the first oxidizable material.

For oxidation of tantalum (Ta), non-limiting examples of electrolyte may include solutions containing citric acid ($C_6H_8O_7$), oxalic acid ($C_2H_2O_4$), boric acid ($H_3BO_3$), ammonium pentaborate ($(NH_4)_2B_{10}O_{16}\times8H_2O$), and/or ammonium tartrate ($H_4NO_2CCH(OH)CH(OH)CO_2NH_4$). It is to be understood that this type of anodization forms a dense oxide.

During anodization of the Ta layer 50, the formed oxide (in this example, tantalum pentoxide ($Ta_2O_5$)) grows through the individual nano-pores 82 defined in nano-pillar template 80 to form a nano-structure 42 in each nano-pore. The orientation of nano-structures 42 are generally controlled by the orientation of the nano-pores 82. In the present example, the nano-structures 42 are substantially orthogonal to substrate 20.

The expansion coefficient of a material to be oxidized is defined as the ratio of oxide volume to consumed material volume. The expansion coefficient for oxidation of tantalum (Ta) is approximately 2.3. Accordingly, in the present example, due to the significant expansion of tantalum pentoxide ($Ta_2O_5$), and the fact that the resulting oxide ($Ta_2O_5$) is dense, the nano-pores 82 are filled from the bottom up. It will be understood that although the first oxidizable material is tantalum (Ta) in the present example, other materials with an expansion coefficient greater than 1 would similarly allow the oxidizable material to squeeze into the nano-pores 82 of nano-structure template 80.

As indicated, the grown oxide will at least partially fill nano-pores 82 of nano-structure template 80 to define nano-structures 42. The geometries of the nano-pillars 42 generally will conform to the geometries of corresponding nano-pores 82, within which the nano-pillars are growing. Nano-pillars 42 thus may take the form of columns, substantially uniformly distributed across substrate 20.

In the present example, each nano-structure has a nominal thickness that corresponds to the nano-pore diameter ($d_p$). Nano-structures 42 are grown to a preliminary nano-structure height ($H_P$). Preliminary nano-structure height ($H_P$) will be less than template height ($h_T$) (FIG. 3B).

The geometry and/or dimensions of the nano-structures 42 may further be controlled by adjusting one or more parameters of the anodization process. For example, the preliminary nano-structure height ($H_P$) will depend on the anodization voltage applied to the first oxidizable material layer 50 during its anodization. In some examples, nano-structures are formed by anodizing the first oxidizable material at a first voltage corresponding to a target preliminary nano-structure height ($H_P$) that may be selected to achieve a desired final nano-structure height ($H_S$), as will be described below.

In one example, nano-structures having a preliminary nano-structure height ($H_P$) of 90 nanometers (at a diameter ($d_p$) of approximately 30 nanometers) may be formed by anodization of Ta layer 50 in a 0.1% solution of citric acid ($C_6H_8O_7$), at a current density of 2 $mA/cm^2$ until voltage reaches 55 Volts, and for 5 minutes more at 55V. It will be appreciated that preliminary nano-structure height ($H_P$) may be tuned to a target preliminary nano-structure height by selecting a corresponding anodization voltage.

Figure 3D:
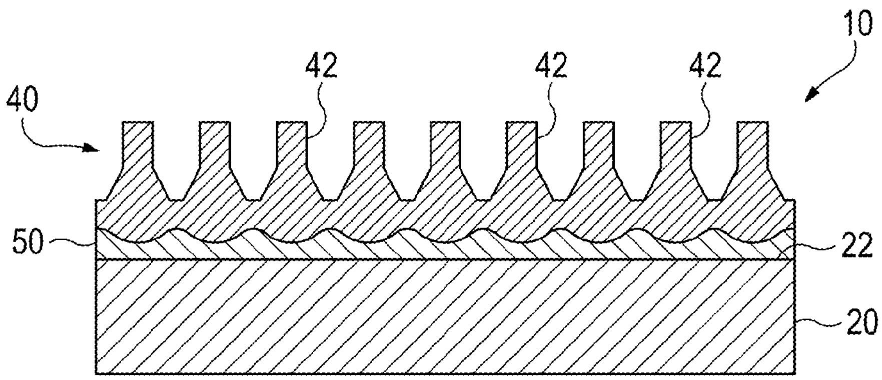

As indicated in FIG. 3D, once nano-structures 42 are grown to the target preliminary nano-structure height ($H_P$), the nano-structure template 80 may be removed to expose the fully formed nano-structures, which define nano-structure array 40. The nano-structure template 80 may be removed using a second selective etching process that will remove the nano-structure template 80 without deleteriously affecting the nano-structures 42, or other features of article 10. In one example, the selective etching may be performed using a selective etchant containing $H_3PO_4$ (92 g), $CrO_3$ (32 g) and $H_2O$ (200 g), at approximately 95° C. It has been found that the example tantalum pentoxide ($Ta_2O_5$) nano-structures 42 can withstand this particular etching process for more than one hour, while the example anodic porous alumina ($Al_2O_3$) nano-structure template 80 is etched away at a rate of about 1 micron per minute. Other selective etchants are also contemplated, dependent on the particular characteristics of the nano-structures, and other features.

Figure 3E:
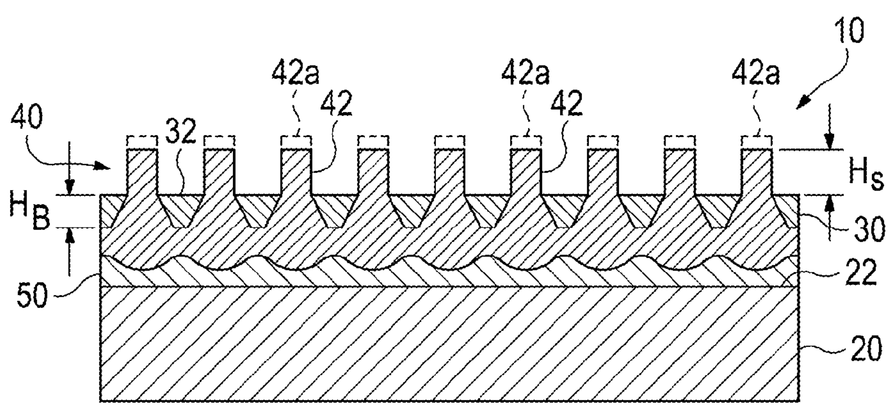

After removal of nano-structure template 80, a base material may be applied on and around the base of nano-structure array 40 to define a base layer 30. As indicated in FIG. 3E, the base material may extend between nano-structures 42 of the nano-structure array. In some examples, the base material is deposited to a depth (shown as base layer height ($H_B$)) that is less than preliminary nano-structure height ($H_P$) (FIG. 3C). In other examples, the base material may be deposited to a depth that is at or near the preliminary nano-structure height ($H_P$). In the present example, nano-structures 42 extend (a distance corresponding to a nano-structure height ($H_S$)) above base layer surface 32.

The base material may be deposited by electrochemical deposition, and may define a substantially planar base surface 32. Electrochemical deposition of the base layer may be achieved using an underlying layer as a cathode in a solution of base material, after removal of nano-structure template 80. In some examples, the underlying layer may be the layer of first oxidizable material 50 (e.g., the Ta layer).

A conductive layer of a multi-layer substrate (or a conductive layer deposited on substrate 20) also may be used as a cathode during electrochemical deposition of the base layer. Accordingly, where the first oxidizable layer 50 (e.g., the Ta layer) is not completely oxidized prior to removal of nano-structure template 80, anodization of the Ta layer may be continued after removal of the nano-structure template. This will tend to make the thickness of the grown oxide substantially uniform between nano-structures 42, and correspondingly, may tend to enhance uniformity of the electrochemical deposition of the base material forming base layer 30.

The base material may be a metal, a polymer, or some other material suitable for electrochemical deposition. Base layer 30 thus may be formed from conductors, semiconductors, dielectric materials, magnetic materials, piezoelectric materials, and other suitable materials. Some examples of base material are Ni, Ag, Au, CdSe, ZnSe and ZnS.

In some examples, caps 42*a* may be formed on the distal ends of nano-structures 42. The cap material may be a metal, a polymer, or some other material suitable for electrochemical deposit on the distal ends of nano-structures 42. Caps 42*a* thus may be formed from conductors, semiconductors, dielectric materials, magnetic materials, piezoelectric materials, and other suitable materials.

In some examples, caps 42*a* are deposited by electrochemical deposit, which may be achieved by using the nano-structures as a cathode in a solution that allows deposition of the cap material, before removal of nano-structure template 80. However, caps 42*a* also may be deposited by a directional deposition technique such as PVD, RF sputtering, etc. (before removal of the nano-structure template). In still other examples, caps 42*a* may be deposited by GLAD deposition (glancing angle deposition), where the angle of deposition may be 85-degrees or more relative to an axis normal to the deposit surface (after removal of the nano-structure template 80).

Although not particularly shown, nano-pores 82 may be re-shaped prior to deposit of caps 42*a*, thereby providing for formation of caps shaped differently than nano-structures 42. In some examples, nano-pores 82 are re-shaped by broadening unfilled sections of the nano-pores 82 (the sections of the nano-pores above the formed nano-structures 42). Such broadening may be achieved by selective etching of the nano-structure template 80. Selective etching may be accomplished by employing an etchant solution configured to etch the exposed areas of porous oxide forming the nano-structure template 80 (e.g., anodic porous alumina, $Al_2O_3$) at a rate that is substantially higher than the etch rate for the oxide of the first oxidizable material (e.g., anodic tantalum pentoxide ($Ta_2O_5$)).

The resulting nano-scale structure 10 may include a nano-structure array 40 with a selectable base layer 30. In some examples, the nano-scale structure 10 may further include an array of nano-scale caps 42*a*. The nano-scale caps may be spaced from the base layer, or may be distributed across the surface of the base layer. Spacing between the base layer and the caps may be controlled by controlling nano-structure height and/or base layer depth.

Figure 4:
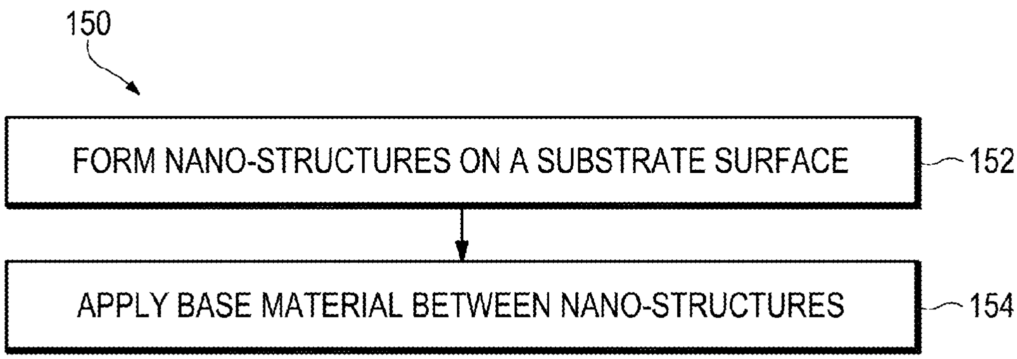
FIG. 4 is a flowchart showing a method of forming a nano-structure array and base layer in accordance with an embodiment of the present invention.

FIG. 4 shows a high-level flowchart 150 of a method of forming a nano-scale structure, as described herein. The method generally includes: (1) forming nano-structures on a substrate surface; and (2); depositing a base material between the nano-structures to form a base layer.

More particularly, at 152, nano-pillars are formed on a substrate surface. At 154, a base material is applied between the nano-structures. In some examples, the nano-pillars may be formed by applying a template to the substrate surface, at least partially filling the template with a nano-structure material to define nano-structures, and removing the template to expose the nano-structures. The nano-structures may be formed of a dense oxide.

The template may be formed using a layer of a second oxidizable material overlying a layer of a first oxidizable material. The second oxidizable material may be anodized to form a template having nano-pores. The template may overlie the first oxidizable material.

Partially filling the nano-pores may include anodizing the layer of first oxidizable material to grow oxide from the first oxidizable material into the nano-pores of the template.

The base material may be applied between the nano-structures using an underlying layer as a cathode in an electrochemical deposition process, after removal of the template. Caps also may be applied to distal ends of the nano-structures using the grown oxide as a cathode in an electrochemical deposition process, before removal of the template.

Figure 5:
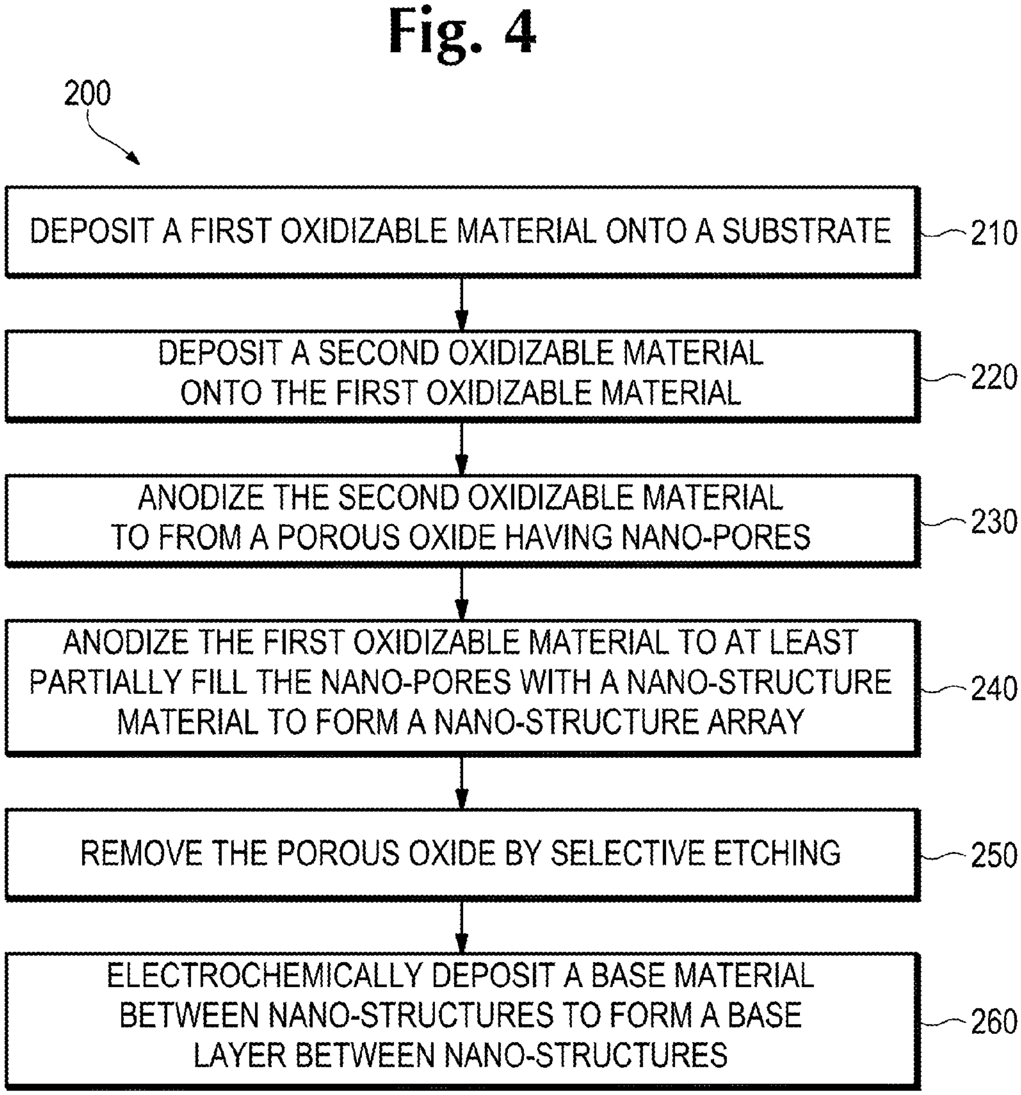
FIG. 5 is a flowchart showing a method of forming a nano-structure array and base layer in accordance with another embodiment of the present invention.

FIG. 5 shows a flowchart 200 of a method of forming a nano-scale structure, as described herein. The method generally includes: (1) depositing a first oxidizable material onto a substrate; (2) depositing a second oxidizable material onto the first oxidizable material; and (3) anodizing the second oxidizable material to form a porous oxide having nano-pores that extend through the porous oxide to expose portions of the first oxidizable material; (4) anodizing the first oxidizable material so as to at least partially fill the nano-pores in the porous oxide with a nano-structure material including an oxide of the first oxidizable material, thereby forming a nano-structure array; (5) removing the porous oxide by selective etching; (6) electrochemically depositing a base material between the nano-structures so as to form a base layer between the nano-structures.

More particularly, at 210, a first oxidizable material (which may take the form of Tantalum (Ta)) is deposited onto a substrate. At 220, a second oxidizable material is deposited onto the first oxidizable material. At 230, the second oxidizable material is anodized to form a porous oxide having nano-pores. At 240 the first oxidizable material is anodized so as to at least partially fill the nano-pores in the porous oxide with an oxide of the first oxidizable material, thereby forming a nano-structure array. At 250, the porous oxide is removed by selective etching, thereby yielding a nano-structure array. At 260, a base material is electrochemically deposited between the nano-structures so as form a base layer between the nano-structures.

In some examples, caps may be formed on the distal ends of the nano-structures. The caps also may be deposited by electrochemical deposit, before removal of nano-structure template. Furthermore, the nano-pores may be re-shaped prior to deposit of the caps, thereby providing for formation of caps shaped differently than nano-structures Although the present invention has been described with reference to certain representative examples, various modifications may be made to these representative examples without departing from the scope of the appended claims.

What is claimed is:

1. A method of forming a nano-scale structure, the method comprising:

forming nano-structures to a preliminary nano-structure height on a conductive layer underlying the nano-structures, the conductive layer disposed on a substrate surface, wherein forming nano-structures includes:

forming a template on the substrate surface, the template defining nano-pores, at least partially filing the nano-pores with a nano-structure material to define the nanostructures by electrochemical oxidation, and removing the template;

applying a base material between the nano-structures to define a base layer having a base layer height, wherein applying the base material includes using the conductive layer as a cathode to electrochemically deposit the base material between the nano-structures to a base layer surface at the base layer height less than the preliminary nano-structure height and the nano-structures extend a nano-structure height above the base layer surface; and depositing a cap material on the nano-structures to define caps on distal ends of the nano-structures.

2. The method of claim 1, wherein forming a template includes:

forming a layer of oxidizable template material; and anodizing the layer of oxidizable template material to define the nano-pores.

3. The method of claim 2, wherein at least partially filling the nano-pores includes:

forming a layer of oxidizable nano-structure material; and anodizing the layer of oxidizable nano-structure material to grow oxide from the oxidizable nano-structure material into the nano-pores, thereby forming nano-structures in the nano-pores.

4. The method of claim 2, wherein the-nano-structures are formed of tantalum pentoxide ($Ta_2O_5$).

5. The method of claim 1, wherein depositing the cap material is by glancing angle deposition where an angle of deposition is 85 degrees or more to an axis normal to the surface of the cap material.

6. The method of claim 1, wherein depositing the cap material is before removing the template and by electrochemical deposition using the nano-structures as a cathode in a solution that allows deposition of the cap material.

7. The method of claim 1, wherein depositing the cap material is before removing the template and by a directional deposition technique.

8. The method of claim 1, further comprising re-shaping the nano-pores after at least partially filling the nano-pores and prior to the depositing the cap material.

9. The method of claim 8 wherein the re-shaping is done by broadening unfilled sections of the nano-pores by selective etching of the template.

10. A method of forming a nano-scale structure, the method comprising:

depositing a first oxidizable material onto a substrate surface as a conductive layer underlying the nano-scale structure;

depositing a second oxidizable material onto the first oxidizable material;

anodizing the second oxidizable material to form a porous oxide having nano-pores that extend through the porous oxide to expose portions of the first oxidizable material;

anodizing the first oxidizable material so as to partially fill the nano-pores in the porous oxide with a nano-structure material including an oxide of the first oxidizable material, thereby forming an array of nano-structures of substantially uniform preliminary nano-structure height on the substrate surface;

depositing a cap material on the array of nano-structures to define caps on distal ends of the nano-structures;

removing porous oxide by selective etching, thereby yielding a substantially planar array of nano-structures on the substrate surface, the nano-structures having capped distal ends; and electrochemically depositing, using the conductive layer as a cathode, a base material between the nano-structures to define a base layer having a base layer height to a base layer surface at the base layer height less than the preliminary nano-structure height and the nano-structures extend a nano-structure height above the base layer surface.

11. The method of claim 10, wherein depositing the cap material is after removing porous oxide and is by glancing angle deposition where an angle of deposition is 85 degrees or more to an axis normal to the surface of the cap material.

12. The method of claim 10, wherein depositing the cap material is before removing porous oxide and by electrochemical deposition using the nano-structures as a cathode in a solution that allows deposition of the cap material.

13. The method of claim 10, wherein depositing the cap material is before removing porous oxide and by a directional deposition technique.

14. The method of claim 10, further comprising re-shaping the nano-pores after anodizing the first oxidizable material so as to partially fill the nano-pores and prior to depositing of the cap material.

15. The method of claim 14 wherein the re-shaping is done by broadening unfilled sections of the nano-pores by selective etching of the porous oxide.

* * * * *